(12) United States Patent
Gold et al.

(10) Patent No.: US 6,438,024 B1
(45) Date of Patent: Aug. 20, 2002

(54) COMBINING RAM AND ROM INTO A SINGLE MEMORY ARRAY

(75) Inventors: Spencer M. Gold, Pepperell; Marc Lamere, Carlisle, both of MA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/758,492

(22) Filed: Jan. 11, 2001

(51) Int. Cl.$^7$ ............................................... G11C 11/00
(52) U.S. Cl. ........................................ 365/154; 365/203
(58) Field of Search ............................ 365/203, 230.03, 365/154

(56) References Cited

U.S. PATENT DOCUMENTS

| | | | |
|---|---|---|---|
| 5,471,421 A | 11/1995 | Rose et al. | 365/182 |
| 5,619,149 A | 4/1997 | Lev et al. | 327/51 |
| 5,675,529 A | 10/1997 | Poole | 365/63 |
| 5,867,443 A | * 2/1999 | Linderman | 365/228 |
| 5,870,341 A | 2/1999 | Lin et al. | 365/200 |
| 5,959,877 A | 9/1999 | Takahashi | 365/104 |

FOREIGN PATENT DOCUMENTS

JP   0008785   * 1/1986 ............ G11C/7/00

OTHER PUBLICATIONS

Betty Prince, "Semiconductor Memories", 1983, Wiley 2$^{nd}$ edition, pp. 656–657.*

* cited by examiner

*Primary Examiner*—M. Tran
(74) *Attorney, Agent, or Firm*—Lahive & Cockfield, LLP (57) ABSTRACT

A memory device that combines RAM and ROM devices into a single memory array is provided. The memory array includes a memory cell for the RAM that is associated with a first bit line and a first word line. The memory array also includes a second memory cell for the ROM that is associated with a second bit line and a second word line. The first bit line and the second bit line are connected with each other. The second memory cell is provided with a circuit that discharges the second bit line to represent a logical value "0" in response to a signal from the second word line.

21 Claims, 7 Drawing Sheets

COMBINING RAM AND ROM INTO A SINGLE MEMORY ARRAY

TECHNICAL FIELD

The present invention relates generally to a memory device and more particularly to a memory device that combines RAM cells and ROM cells into a single array and the method therefor.

BACKGROUND OF THE INVENTION

Memory devices are essential in microprocessor systems in order to store both the program instructions and the data needed for the microprocessor to execute the program instructions. Memory devices are a collection of sequential memory cells that have a unique address and a capacity for storing information. Memory devices can be categorized according to their functions and fall into two major categories, read-only-memory (ROM) devices and write-and-read memory (or random-access memory: RAM) devices.

Within the category of RAM devices, there are two types of memory devices, static RAM (SRAM) devices and dynamic RAM (DRAM) devices. DRAM devices need to be refreshed periodically to prevent the corruption of their contents due to charge leakage. In contrast, SRAM devices need not be refreshed. Both of them are volatile memory devices, which means that the contents will be lost when the power supply is removed. RAM devices can be made non-volatile by using a backup battery that ensures power will not be lost.

ROM devices are non-volatile memories that retain the contents even when the power is turned off. Information stored in ROM devices is permanent. In many systems, it is desirable to have system level software (e.g. BIOS) stored in a ROM device, because such software is seldom changed. In some cases, ROM devices store invariant data that is needed for the microprocessor to execute the program instructions. The ROM device can be read reliably without destroying the stored data.

In conventional microprocessor systems, separate RAM and ROM devices are used to store data that is variant and invariant, respectively. In separate RAM and ROM systems, the RAM or ROM devices have their own arrays that includes memory cells to store information. Accordingly, conventional systems implement separate RAM and ROM devices and thus, occupy a large amount of space in such microprocessor systems. In addition, the conventional system increases the cost for the microprocessor system by paying for separate RAM and ROM devices.

SUMMARY OF THE INVENTION

A memory device is provided for a microprocessor system. In particular, RAM cells and ROM cells are combined into a single memory array. The memory device includes memory cells acting as RAM and memory cells acting as ROM in a memory array.

In accordance with one aspect of the present invention, a memory array that combines Random Access Memory (RAM) cells and Read Only Memory (ROM) cells into a single memory array is provided. The memory array includes a RAM cell that is associated with a bit line and a word line. The memory array also includes a ROM cell that is associated with the bit line and the word line. The ROM cell provides a logical value to the bit line in response to signals from the word line.

The memory device may also include a precharger for precharging the bit lines of the memory cells before read operation of the cells. The memory device may additionally include a decoder for decoding address signals of the memory cells to select a memory cell.

Further, a method for combining RAM cells and ROM cells into a single memory array is provided. First, the method provides the RAM cells and ROM cells in a single memory array. The memory cells of a same row are connected to a word line and the memory cells first orientation (e.g. row) of a same second orientation (e.g. column) are connected to a bit line. The method also provides a ROM cell with a logic circuit that provides a logical value to the bit line in response to signals from the word line.

The present invention may be applied to any type of memory array, such as a memory array embedded in the microprocessor as well as a stand alone memory array. The memory device that combines RAM cells and ROM cells into a single memory array may be implemented based on any type of memory cell, for example, SRAM cells or DRAM cells.

BRIEF DESCRIPTION OF THE DRAWINGS

An illustrative embodiment of the present invention will be described below relative to the following drawings.

DETAILED DESCRIPTION OF THE INVENTION

The illustrative embodiment of the present invention implements a memory device that combines random access memory (RAM) and read only memory (ROM) into a single memory array. The memory array includes RAM cells and ROM cells in the single array. The memory device may be implemented as a stand alone device or embedded in a microprocessor as a memory element, such as a register file.

In the illustrative embodiment, RAM cells and ROM cells are implemented in a single memory array. The memory cells of the same row in the memory array are connected to a same word line to which a selection signal for selecting a row of the RAM cells or ROM cells is provided. In addition, the memory cells of the same column in the memory array are connected to a same bit line and/or complementary bit line (i.e., a bit line having the complementary logical value as the other bit line). Data that is to be written in the RAM cells is provided from a write data buffer through the bit line and/or complementary bit line. Data that is read from the RAM cells or ROM cells is provided to a sense amplifier through the bit line and/or complementary bit line.

In the operation for writing data in a row of RAM cells, an address that corresponds to the row of the RAM cells where the data is to be written is decoded in a write data decoder. The write data decoder generates a selection signal for selecting the row of the RAM cells and provides the selection signal to a word line to which the RAM cells of the row are connected. Data that is to be written in the row of the RAM cells is stored in a write data buffer and provided to bit lines and/or complementary bit lines. The data provided through the bit lines and/or complementary bit lines is written in the row of the RAM cells enabled by the selection signal from the word line.

In an operation for reading data from a row of RAM cells or ROM cells, an address that corresponds to the row of RAM cells or ROM cells from which the data is read is decoded in a read data decoder. The addresses that correspond to the ROM cells are removed from the RAM cells to avoid conflicting of addresses in RAM cells and ROM cells. The read data decoder generates a selection signal for selecting the row of the RAM cells or ROM cells and provides the selection signal to a word line to which the RAM cells or ROM cells of the row are connected. Before data is read from the row RAM cells or ROM cells, the bit lines and/or complementary bit lines are precharged to a predetermined level by a precharger. The precharged bit lines and/or complementary bit lines are discharged or remain charged based on the data in the RAM cells or ROM cells. The data conveyed through the bit lines and/or complementary bit lines are detected in a sense amplifier.

In RAM cells, a storage element, such as a flip flop in a SRAM cell or a capacitor in a DRAM cell, is provided. A switching element, such as a pass transistor, is coupled between the bit line and the storage element. Another switching element may be coupled between the complementary bit line and the storage element. The switching elements are also connected to a word line and controlled by a selection signal to convey data from the bit line to the storage element or from the storage element to the bit line.

In a ROM cell, the storage element provided in the RAM cells is removed. The ROM cell is provided with a switching element (e.g. pass transistor) that is connected between a bit line and a ground or complementary bit line and a ground. The switching element is controlled by a selection signal from a corresponding word line. The switching element that is connected between a bit line and a ground level may provide a logical value "0" to the bit line in response to selection signals from the word line. In addition, the switching element that is connected between a complementary bit line and a ground may provide a logical value "1" to the bit line in response to selection signals from the word line. Where the switching element is a transistor, the transistor in the ROM cell should be sized to provide the same or similar pull down current to that of the RAM cell to provide compatibility with sense amplifiers and bit line prechargers provided for the memory array.

The illustrative embodiment of the present invention provides a compact microprocessor system by combining RAM cell and ROM cells into a single memory array. The combined memory array reduces space for the memory devices for RAM and ROM in a microprocessor system. The single memory array also reduces the number of memory devices in implementing a microprocessor system.

In order to further enhance space savings, the illustrative embodiment of the present invention may map multiple row addresses (e.g. 0, 8, 16, 24, etc.) to a single row of ROM cells. In this case, each of the addressed rows is to have a common value (e.g. "0") and, therefore, there is no need for multiple duplicative rows of ROM; rather the address circuitry may be manipulated to map those row addresses to a single physical row.

Figure 1:
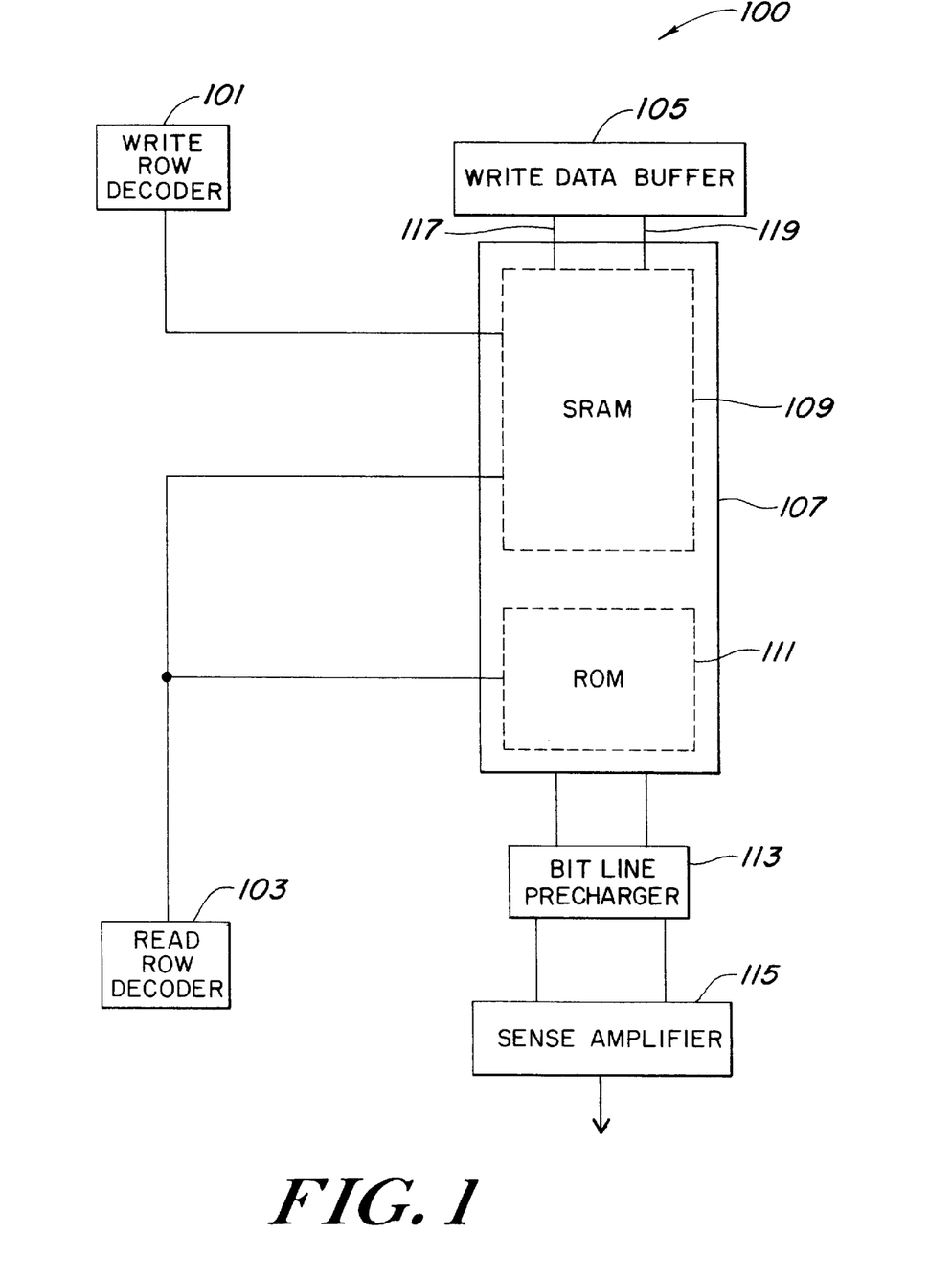
FIG. 1 is a block diagram illustrating the structure of a memory device that combines RAM cells and ROM cells into a single memory array in the illustrative embodiment of the present invention.

FIG. 1 shows a block diagram of a memory device that combines RAM cells and ROM cells into a single memory array. The memory device 100 includes a write row decoder 101, a read row decoder 103, a write data buffer 105, a memory array 107, a bit line precharger 113 and a sense amplifier 115. The memory array 107 combines SRAM cells 109 and ROM cells 111 into a single array. Even though the illustrative embodiment is implemented based on SRAM cells, those of skill in the art will appreciate that other type of RAM cells may be adopted to implement the present invention. For example, the illustrative embodiment may be implemented based on DRAM cells.

The write row decoder 101 is coupled to SRAM cells 109 in the memory array 107. The write row decoder 101 receives an address of a row in the SRAM cells 109 where data is to be written. The write row decoder 101 decodes the address to select the row to which the address corresponds in the SRAM cells 109. The write row decoder 101 provides a selection signal to a word line to which the RAM cells of the row are connected. Memory cells of the same row in the memory array 107 are connected to a same word line. The relationship between a memory cell and a word line is described below in more detail.

The write data buffer 105 receives data that is to be written in the SRAM cells 109. The write data buffer 105 temporarily stores the data and provides them to the selected row of the SRAM cells through bit lines 117 and complementary bit lines 119. SRAM cells of a same column are connected to a same bit line and complementary bit line. Data that is provided through the bit lines 117 and complementary bit lines 119 is written in the row of SRAM cells that is enabled by the selection signal that is provided through the word line of the row.

Each SRAM cell is associated with bit lines 117 and complementary bit lines 119. Those of skill in the art will appreciate that in the case of implementing the present invention based on DRAM cells, each DRAM cell is associated with a bit line. The relationship between a SRAM cell and a bit line and complementary bit line is described below in more detail.

The read row decoder 103 is coupled to RAM cells 109 and ROM cells 111 in the memory array 107. The read row decoder 103 receives an address of a row in the memory array 107 from which data is to be read. The read row decoder 103 decodes the address to select a row to which the address corresponds in the memory array 107. The read row decoder 103 provides a selection signal to a word line to which memory cells of the row are connected.

Before a selection signal is provided to a word line of the row in the memory array 107, the bit line precharger 113 charges the bit lines 117 and complementary bit lines 119 to a predetermined level. The predetermined level may be a voltage level that corresponds to a logical high value. Memory cells in the row of the memory array 107 are enabled by a selection signal provided through a word line to which the memory cells of the row are connected. Either the precharged bit lines or complementary bit lines are discharged depending on the data stored in the memory cells.

The sense amplifier 115 detects the levels of the bit lines for each column. The sense amplifier 115 amplifies the detected level to a value that corresponds to a logical high value or a logical low value.

Figure 2:
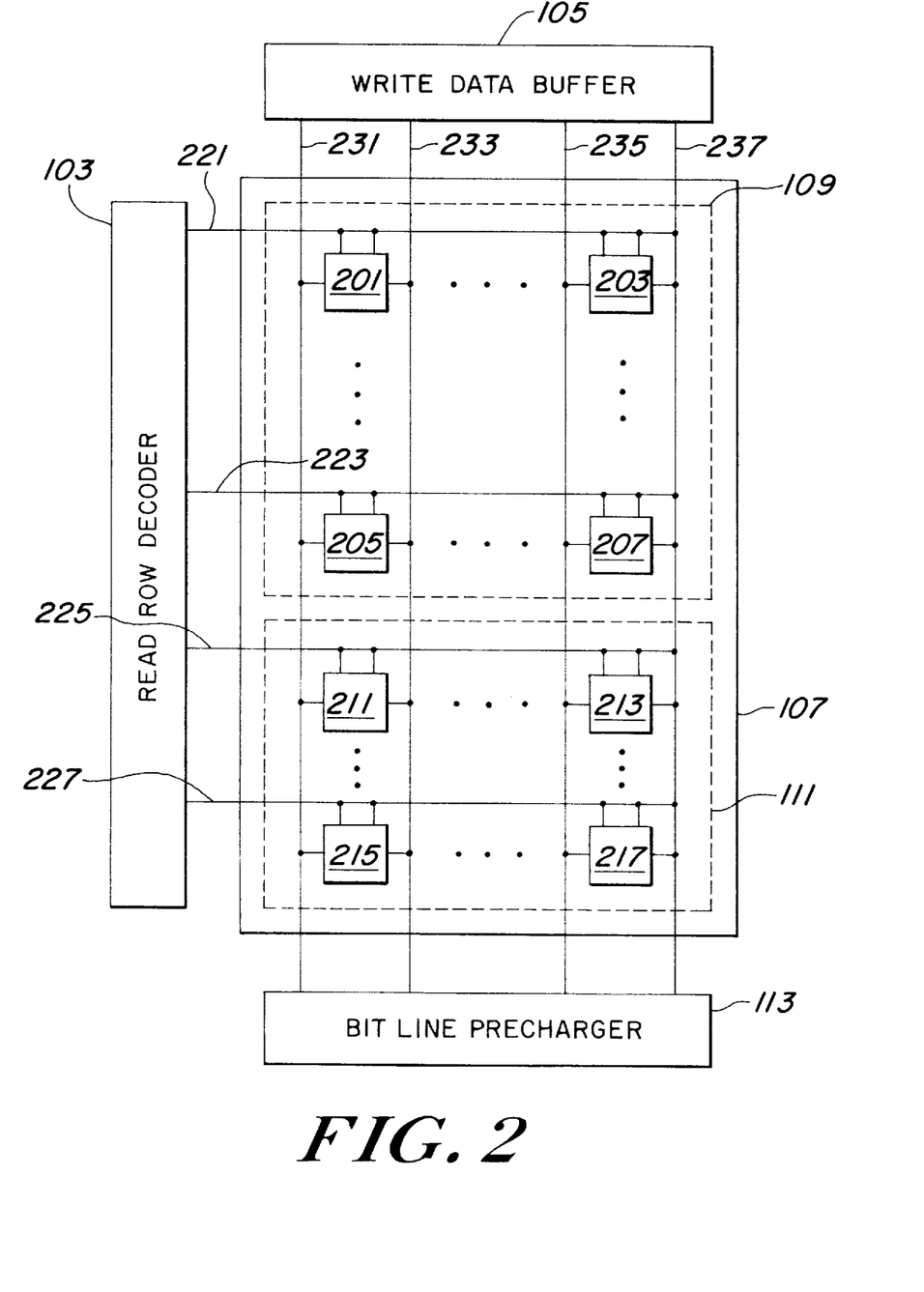
FIG. 2 is a block diagram that shows in more detail a memory array that includes RAM cells and ROM cells in a single memory array.

FIG. 2 shows a block diagram of a memory array 107 that combines RAM cells 109 and ROM cells 111 into a single memory array. The reference numbers for a write row decoder 101, a read row decoder 103, a write data buffer 105, a memory array 107, a bit line precharger 113 are used as the same as in FIG. 1. As described above, the memory array 107 combines SRAM cells 109 and ROM cells 111. The SRAM cells 109 provide a matrix structure that includes rows and columns. The ROM cells 111 also provide a matrix structure that includes rows and columns.

SRAM cells and ROM cells of the same row are connected to the same word line. For example, SRAM cells 201 and 203 are connected to the same word line 221 and SRAM cells 205 and 207 to word line 223. In addition, ROM cells 211 and 213 are connected to the same word line 225, and ROM cells 215 and 217 to a word line 227. The memory cells of the same column are connected to the same bit line and complementary bit lines. For example, SRAM cells 201 and 205 and ROM cells 211 and 215 are connected to the same bit line 231 and complementary bit line 233. Similarly, SRAM cells 203 and 207 and ROM cells 213 and 217 are connected to the same bit line 235 and complementary bit line 237.

Figure 3:
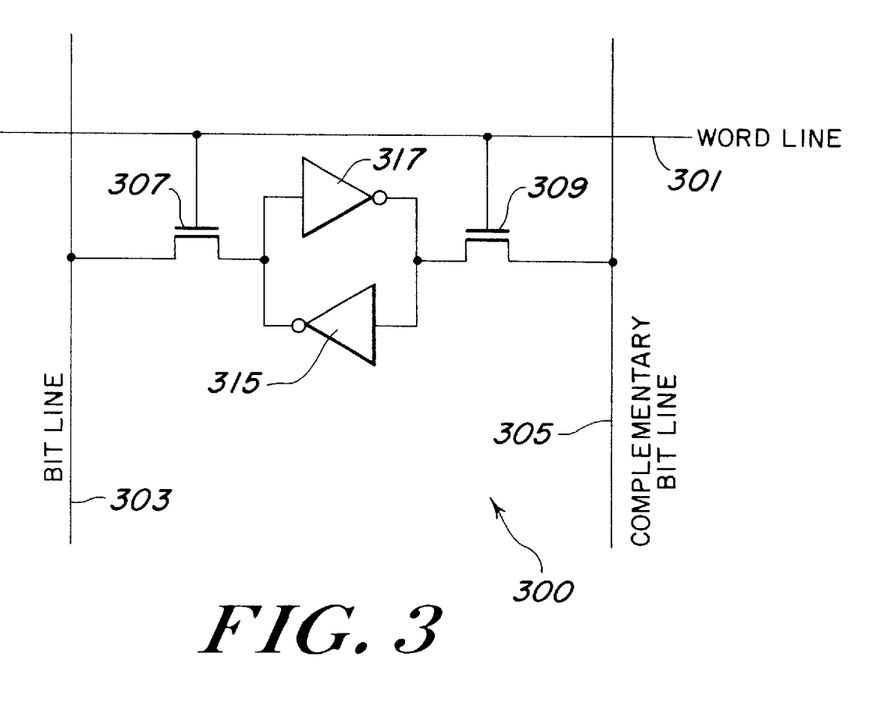
FIG. 3 is a circuit illustrating an example of a standard SRAM cell that is combined with ROM cells into a single memory array in the illustrative embodiment.

FIG. 3 is an example of a circuit diagram for an SRAM cell 300 in the illustrative embodiment of the present invention. The SRAM cell 300 includes two pass transistors 307 and 309 and storage elements 315 and 317. The SRAM cell 300 is associated with a word line 301, a bit line 303 and a complementary bit line 305. The pass transistors 307 and 309 are controlled by a selection signal from the word line 301. The pass transistor 307 is connected between bit line 303 and storage elements 315 and 317. The pass transistor 309 is connected between complementary bit line 305 and storage elements 315 and 317.

Bit line 303 and complementary bit line 305 are precharged. During a read operation, the write data buffer 105 does not drive the bit lines 303 and 305. As a result, the memory cells are allowed to discharge to the appropriate one of the bit lines 303 and 305. However, during a write operation, the write data buffer 105 overpowers the storage elements 315 and 317 to force a new value to be stored in the storage elements.

Figure 4A:
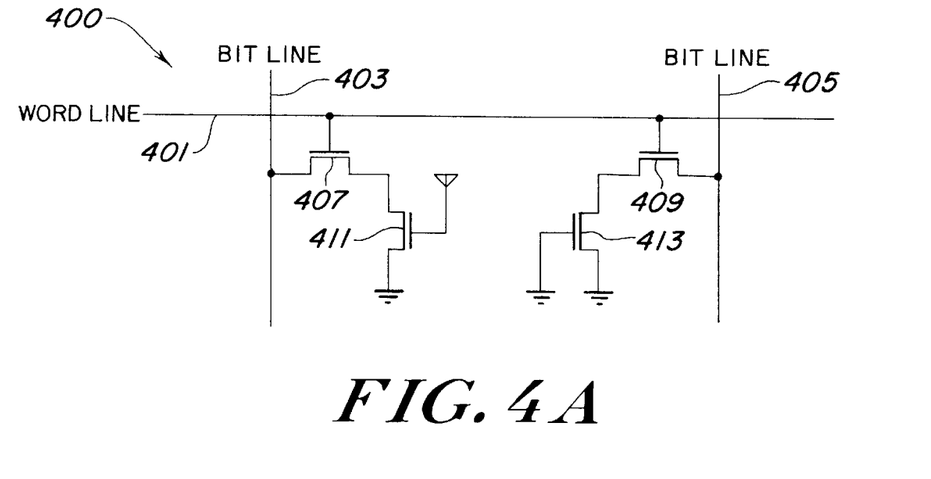
FIG. 4A shows an exemplary circuit for a ROM cell representing a logical value "0" that is combined with RAM cells into a single memory array in the illustrative embodiment.

FIG. 4A is an example of a circuit diagram for a ROM cell 400 that holds a logical value "0" in the illustrative embodiment of the present invention. The ROM cell 400 in FIG. 4A includes four transistors 407, 409, 411 and 413. Transistors 407 and 409 are controlled by a selection signal from a word line 401. Transistor 407 is connected between a bit line 403 and transistor 411, which is tied to ground. The transistor 409 is connected between a complementary bit line 405 and transistor 413, which is tied to ground. In comparison with the SRAM cell 300 in FIG. 3, inverters 315 and 317 acting as storage elements are removed from the ROM cell 400. Instead, the gate of transistor 411 is coupled to a high level voltage and the gate of transistor 413 is coupled to ground.

When a selection signal is provided to the word line 401, transistors 407 and 409 turn "on." In addition, transistor 411 turns "on" and transistor 413 turns "off." Accordingly, the bit line 403 is discharged to a ground level. Complementary bit line 405 remains charged to a predetermined voltage level. The circuit shown in FIG. 4A may be simplified to the circuit shown in FIG. 4B, because transistors 411 and 413 are always "on" and "off," respectively.

Figure 4B:
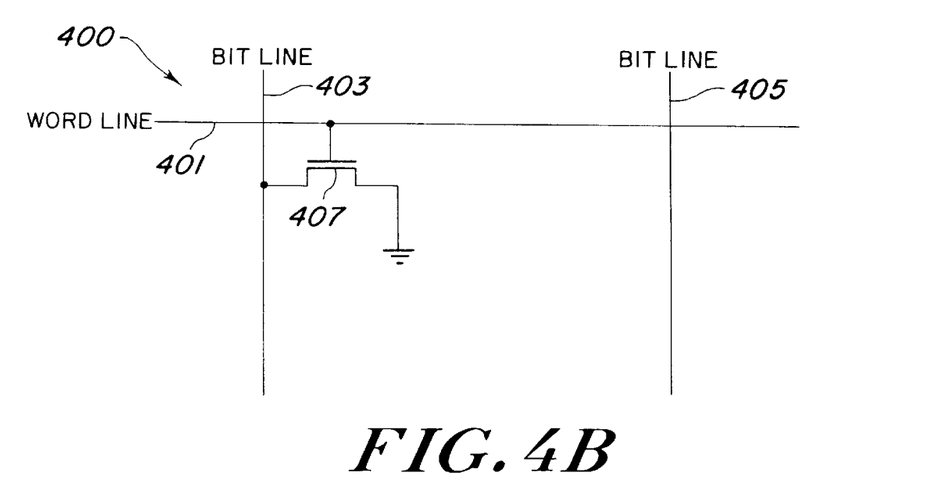
FIG. 4B is an equivalent circuit of a ROM cell shown in FIG. 4A.

FIG. 4B is an alternative circuit diagram of FIG. 4A. Transistor 407 is connected to ground because the transistor that is connected between transistor 407 and ground is "on." In addition, transistor 409 is removed from the ROM cell 400 because transistor 413, which is connected between the transistor 409 and ground is "off." If a selection signal is provided to the word line 401, the precharged bit line 403 is discharged through the transistor 407 to ground. Complementary bit line 405 remains charged to a predetermined voltage that corresponds to a logical high value.

Figure 5A:
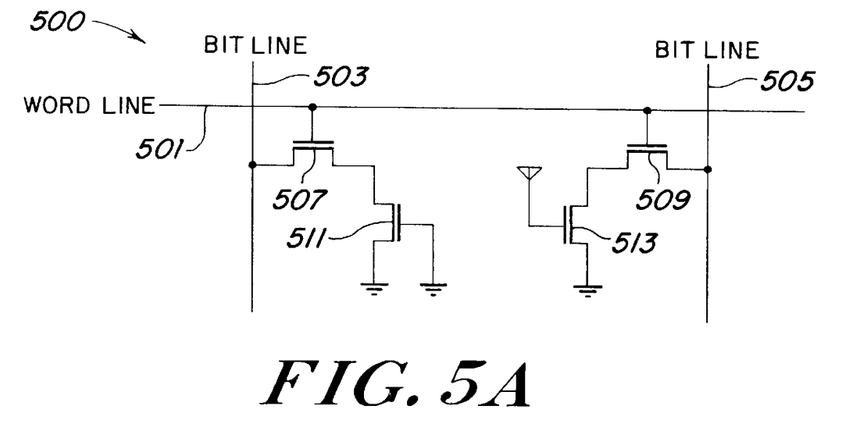
FIG. 5 shows an exemplary circuit for a ROM cell representing a logical value "1" that is combined with RAM cells into a single memory array in the illustrative embodiment.

FIG. 5A is an example of a circuit diagram for a ROM cell 500 that represent a logical value "1" in the illustrative embodiment of the present invention. The ROM cell 500 includes four transistors 507, 509, 511 and 513. Transistors 507 and 509 are controlled by a selection signal from a word line 501. Transistor 507 is connected between a bit line 503 and transistor 511, which is coupled to ground. Transistor 509 is connected between a complementary bit line 505 and transistor 513, which is coupled to ground. The gate of transistor 511 is pulled down to ground, which makes transistor 511 always "off." In contrast, the gate of transistor 513 is pulled up to a high level, which makes transistor 513 always "on."

If a selection signal is provided to word line 501, complementary bit line 505 is discharged to ground through the transistors 509 and 513. Bit line 503 remains charged to a precharged voltage level that corresponds to a logical high value. The circuit shown in FIG. 5A may also be simplified to the circuit shown in FIG. 5B because the transistors 511 and 513 are always "off" and "on," respectively.

Figure 5B:
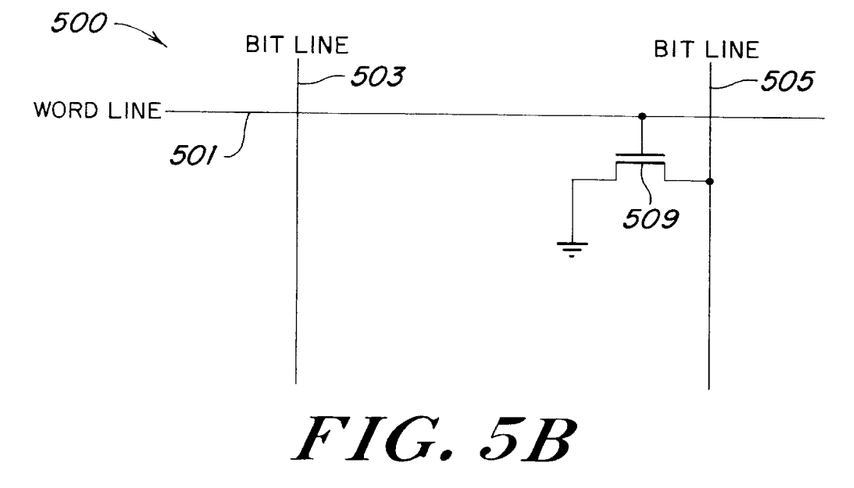
FIG. 5B is an equivalent circuit of a ROM cell shown in FIG. 5A.

FIG. 5B is an alternative circuit for the circuit depicted in FIG. 5A. Transistor 507 is removed from the ROM cell 500 in FIG. 5B because transistor 511 that is connected between transistor 507 and ground is "off." Transistor 509 is connected to ground because transistor 513, which is connected between transistor 509 and ground is "on." If a selection signal is provided to word line 501, the precharged complementary bit line 505 is discharged through the transistor 509 to ground. Bit line 503 remains charged to a precharged voltage that corresponds to a high level value.

Figure 6:
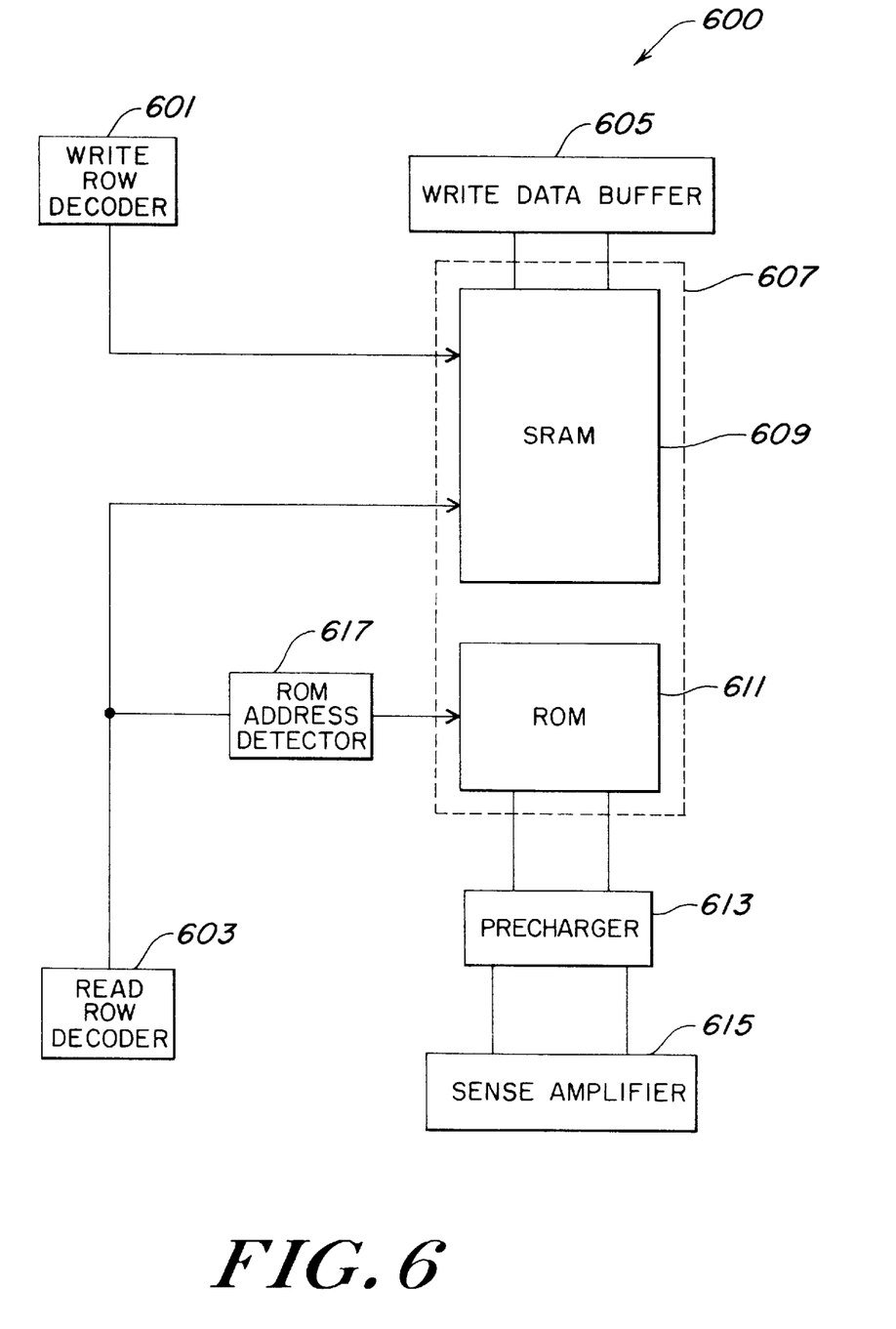
FIG. 6 is a block diagram illustrating a register file embedded in a microprocessor that combines SRAM cells and ROM cells into a single memory array in the illustrative embodiment of the present invention.

FIG. 6 shows an exemplary circuitry for implementing a register file in a microprocessor by using a memory array that combines RAM cells and ROM cells into a single memory array. For example, a Sun Microsystems' SPARC-V9™ microprocessor includes a register file containing registers. The registers are mapped to locations of memory arrays that physically store the registers. The registers includes general purpose registers that are used by the processor to execute instructions. One of the general purpose registers g0 always reads as zero, which is used to transfer 0's to registers and memory elements. Therefore, the illustrative embodiment implements the register g0 by using ROM cells that are combined with SRAM cells in a single memory array.

The register file 600 includes a write row decoder 601, a read row decoder 603, a write data buffer 605, a memory array 607, a bit line precharger 613, a sense amplifier 615 and a ROM address detector 617. The memory array 607 combines ROM cells for register g0 and SRAM cells 609 for other registers into a single array 607. The implementation of register g0 is described below in more detail.

The write row decoder 601 and read row decoder 603 are coupled to SRAM cells 609 in the memory array 607 that correspond to registers. The write row decoder 601 and read row decoder 603 receive addresses of a register and decode the addresses of the register. The write row decoder 601 and read row decoder 603 generate selection signals for selecting the register and provide the selection signals to word lines to which memory cells of the register are connected. Memory cells of the same row in the memory array 607 are connected to the same word line.

The write data buffer 605 provides data to the selected register. Memory cells of the same column are connected to the same bit line and the same complementary bit line. Data that is provided through the bit lines and complementary bit lines is written in the memory cells of a row that is enabled by the selection signal provided through the word line of the row.

Before a selection signal is provided to a word line of the row in the memory array 607 from which data is to be read, the bit line precharger charges the bit lines and complementary bit lines to a predetermined level. The predetermined level may be a voltage level that corresponds to a logical high level. Memory cells in the row of the memory array 607 are enabled by a selection signal provided through a word line to which the memory cells in the row are connected. Either the precharged bit lines or complementary bit lines are discharged depending on the data stored in the memory cells. The sense amplifier 615 detects the levels of the bit lines for each column. The sense amplifier 615 amplifies the detected level to a logical high or low level.

The ROM address detector 617 detects an occurrence of an address that is assigned to register g0. For example, the illustrative embodiment assigns four addresses 0, 8, 16 and 24 to register g0, the ROM address detector 617 detects the generation of selection signals that correspond to the addresses 0, 8, 16 and 24. As a result, the ROM address detector provides a selection signal to the word line that corresponds to register g0 in response to the occurrence of at least one of the addresses 0, 8, 16 and 24. In order to avoid address conflict, a row or group of rows are removed from SRAM cells that have the same address as register g0. That is, rows that have addresses 0, 8, 16 and 24 are removed from the SRAM cells 609.

Figure 7:
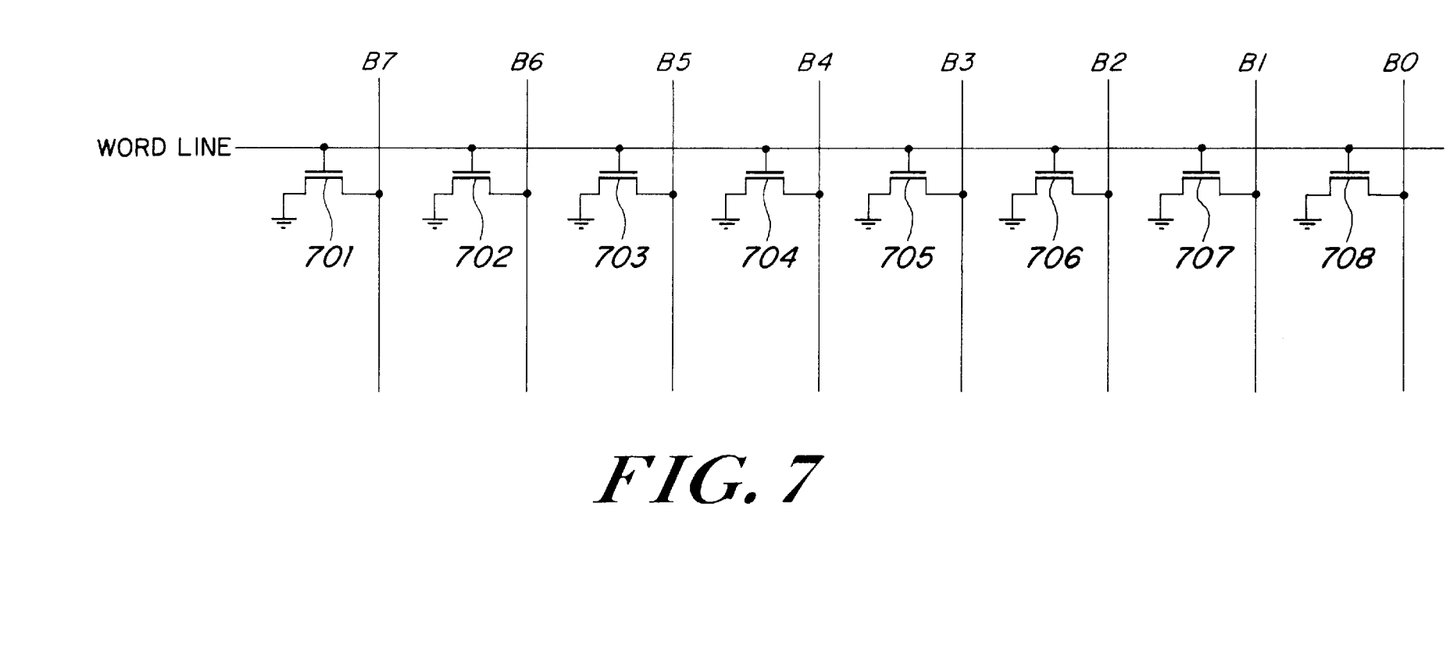
FIG. 7 shows an exemplary circuit of global register g0 in the register file that is implemented by using ROM cells depicted in FIG. 4B in the illustrative embodiment.

FIG. 7 is an exemplary circuit diagram implementing register g0 that reads zero in the illustrative embodiment of the present invention. Register g0 that has bits width includes eight rows, each of which has eight column bits. Accordingly, there are provided a word line and eight bit lines B01–B7. As shown in FIG. 4B, a ROM cell is implemented to represent a logical value "0" by connecting a transistor between a bit line and ground. The transistor is controlled by a selection signal from a word line.

In FIG. 7, eight transistors 701–708 are used to implement register g0. The sources of the transistors 701–708 are connected to ground, and the drain of each transistor is connected to the asserted low read data bit lines. The gate of each transistor is connected to each word line. If one of the addresses 0, 8, 16 and 24 is selected, a selection signal is provided to word lines w1–w8 that turns the transistors 701–708 "on." The precharged bit lines B0–B7 are discharged to ground through the transistors 701–708. The discharged bit lines are detected in the sense amplifier 609 and converted to a level that corresponds to logical value "0."

It is apparent that there has been provided, in accordance with the present invention, a memory device that combines RAM cells and ROM cells into a single memory array. While this invention has been described in conjunction with illustrative embodiments thereof, it is evident that many alternatives, modifications, and variations will be apparent to those skilled in the art. For example, the present invention can be implemented as a stand alone device or embedded in a microprocessor. In addition, the present invention may be implemented based on any type of RAM that includes SRAM and DRAM. Accordingly, it is intended to embrace all such alternatives, modifications and variations that fall within the spirit and broad scope of the appended claims.

What is claimed is:

1. A memory array, comprising:

a first memory cell for Random Access Memory (RAM) that is associated with a bit line and a word line;

a second memory cell for Read Only Memory (ROM) that is associated with the bit line and the word line; and a circuit associated with the second memory cell for providing the bit line with a logical value in response to a signal from the word line, the circuit including a switching element connected between the bit line and ground and wherein the circuit is controlled by the signal from the word line.

2. The array of claim 1 wherein said first memory cell for the RAM is a static RAM (SRAM) cell.

3. The array of claim 1 wherein said first memory cell for the RAM is a dynamic RAM (DRAM) cell.

4. The array of claim 1 wherein said bit line is precharged before a read operation or a write operation.

5. The array of claim 4 wherein said array further includes means for preventing the line when precharged from discharging to represent a logical value "1" in response to a signal from the word line.

6. The array of claim 1 wherein said word line provided signals for selecting the first and second memory cells, said signals being produced by decoding signals for the addresses of the first and second memory cells.

7. A memory device, comprising:

a memory array that combines RAM cells and ROM cells into a single array, each said cell being associated with a word line and a bit line;

a precharger for precharging the bit lines of the memory cells before read operation of the cells; and a decoder for decoding an address that corresponds to a row of the memory cell and generating a selection signal for selecting the row.

8. The device of claim 7 wherein said memory array includes at least a plurality of RAM cells grouped in a first orientation and a plurality of ROM cells grouped in a second orientation, said memory cells of a same orientation being connected to a same word line.

9. The device of claim 7 wherein said memory cells of a same column are connected to a same bit line.

10. The device of claim 7 wherein said ROM cell includes a switching element connected between the word line and the bit line to provide the bit line with a logical value in response to the signals from the word line.

11. The device of claim 10 wherein said switching element is a transistor and said transistor is pulled down to ground to provide a logical value '0' in response to the signals for selecting the ROM cell.

12. The device of claim 10 wherein said switching element is open ended to provide a logical value '1' in response to the signals for selecting the ROM cell.

13. A method for combining RAM cells and ROM cells into a memory device, said method comprising the steps of:
   providing the RAM cells and ROM cells in a single array;
   connecting the memory cells of a same first orientation to a same word line;
   connecting the memory cells of a same second orientation to a same bit line;
   providing a RAM cell with a logic circuit that provides a logical value to the bit line in response to signals from the word line, the logic circuit adapted to include a switching element connected between the bit line and the word line to provide a logical value "0" to the bit line in response to signals from the word line.

14. The method of claim 13 wherein said RAM cells include a static RAM (SRAM) cell.

15. The method of claim 13 wherein said RAM cells includes a dynamic RAM (DRAM) cell.

16. The method of claim 13 wherein said switching element is a transistor and wherein said transistor includes a gate connected to the word line, a source connected to the bit line and a drain connected to ground.

17. A microprocessor, comprising:
   a memory array that combines RAM cells and ROM cells into a single memory array, each said memory cell being associated with a word line and a bit line;
   a precharger for precharging the bit line of the memory cell before read or write operation of the cell; and
   a decoder for decoding address signals of the memory cell to select a memory cell.

18. The device of claim 17 wherein said memory array includes at least RAM cells in a first orientation and ROM cells in a second orientation, the memory cells of a same orientation being connected to a same word line.

19. The device of claim 17 wherein said memory cells of a same column are connected to a same bit line.

20. The device of claim 17 wherein said ROM cell includes a switching element connected between the word line and the bit line to provide a logical value.

21. The device of claim 17 wherein said switching element is a transistor that is pulled down to ground to discharge the bit line to a logical value "0."

* * * * *